US006577535B2

(12) United States Patent
Pasternak

(10) Patent No.: US 6,577,535 B2
(45) Date of Patent: Jun. 10, 2003

(54) METHOD AND SYSTEM FOR DISTRIBUTED POWER GENERATION IN MULTI-CHIP MEMORY SYSTEMS

(75) Inventor: John H. Pasternak, Santa Clara, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/785,915

(22) Filed: Feb. 16, 2001

(65) Prior Publication Data

US 2002/0141238 A1 Oct. 3, 2002

(51) Int. Cl.[7] .............................................. G11C 16/04
(52) U.S. Cl. ................................... 365/185.11; 365/226
(58) Field of Search ....................... 365/185.05, 185.11, 365/229, 226, 230.03, 189.09, 4

(56) References Cited

U.S. PATENT DOCUMENTS

| | | | |
|---|---|---|---|
| 4,433,282 A | 2/1984 | Squires ........................ 323/281 |
| 4,578,772 A | 3/1986 | Fujii ........................... 364/850 |
| 4,970,692 A | 11/1990 | Ali et al. ..................... 365/218 |
| 5,172,338 A | 12/1992 | Mehrotra et al. ........... 365/185 |
| 5,196,739 A | 3/1993 | Sandhu et al. ........... 307/296.1 |
| 5,267,218 A | 11/1993 | Elbert ......................... 365/226 |
| 5,276,646 A | 1/1994 | Kim et al. ............. 365/189.09 |
| 5,291,446 A | 3/1994 | Van Buskirk et al. .. 365/189.09 |
| 5,305,275 A | 4/1994 | Yamashita et al. .......... 365/226 |
| 5,306,961 A * | 4/1994 | Leo ............................. 365/229 |
| 5,388,084 A | 2/1995 | Itoh et al. .................... 365/226 |
| 5,394,027 A | 2/1995 | Park ............................ 327/536 |
| 5,418,752 A | 5/1995 | Harari et al. ................ 365/218 |
| 5,426,391 A | 6/1995 | Tedrow et al. .............. 327/530 |
| 5,430,859 A | 7/1995 | Norman et al. ............. 395/425 |
| 5,440,520 A | 8/1995 | Schutz et al. ............... 365/226 |
| 5,442,586 A | 8/1995 | Javanifard et al. .......... 365/185 |
| 5,444,664 A | 8/1995 | Kuroda et al. .............. 365/226 |
| 5,455,794 A | 10/1995 | Javanifard et al. ..... 365/185.18 |
| 5,508,971 A | 4/1996 | Cernea et al. ......... 365/185.23 |
| 5,511,026 A | 4/1996 | Cleveland et al. ..... 365/189.09 |
| 5,519,654 A | 5/1996 | Kato et al. ............. 365/185.23 |
| 5,524,231 A | 6/1996 | Brown |
| 5,553,261 A | 9/1996 | Hasbun et al. |
| 5,563,825 A | 10/1996 | Cernea et al. ......... 365/185.18 |
| 5,568,424 A | 10/1996 | Cernea et al. ......... 365/185.33 |
| 5,592,420 A | 1/1997 | Cernea et al. ......... 365/185.18 |
| 5,596,532 A | 1/1997 | Cernea et al. ......... 365/185.18 |
| 5,598,370 A | 1/1997 | Niijima et al. |
| 5,621,685 A | 4/1997 | Cernea et al. |
| 5,671,179 A | 9/1997 | Javanifard ............. 365/185.33 |
| 5,693,570 A * | 12/1997 | Cernea et al. ............... 429/100 |
| 5,694,360 A | 12/1997 | Iizuka et al. .......... 365/185.33 |
| 5,818,781 A | 10/1998 | Estakhri et al. ............. 365/226 |

FOREIGN PATENT DOCUMENTS

| | | | |
|---|---|---|---|
| WO | WO 01/95332 | 12/2001 | ............ G11C/5/06 |
| WO | WO 02/075744 | 9/2002 | ............ G11C/5/14 |

OTHER PUBLICATIONS

International Search Report from related PCT Application (PCT/US02/03618), Dec. 4, 2002.

* cited by examiner

Primary Examiner—Michael S. Lebentritt
Assistant Examiner—Anh Phung
(74) Attorney, Agent, or Firm—Beyer Weaver & Thomas, LLP

(57) ABSTRACT

Techniques for producing and supplying various voltage levels within a memory system having multiple memory blocks (e.g., memory chips) are disclosed. The various voltage levels can be produced by charge pump and regulator circuitry within the memory system. The various voltage levels can be supplied to the multiple memory blocks through a power bus. According to one aspect of the invention, charge pump and regulator circuitry is not only provided within each of the memory blocks of a memory system, but also the charge pump and regulator circuits are not used to supply voltage signals to their own memory blocks. Instead, the charge pump and regulator circuits are used to supply voltage signals to other memory blocks.

34 Claims, 7 Drawing Sheets

METHOD AND SYSTEM FOR DISTRIBUTED POWER GENERATION IN MULTI-CHIP MEMORY SYSTEMS

CROSS REFERENCE TO RELATED APPLICATION

This application is related to U.S. patent application Ser. No. 09/788,120, now U.S. Pat. No. 6,434,044, entitled "METHOD AND SYSTEM FOR GENERATION AND DISTRIBUTION OF SUPPLY VOLTAGES IN MEMORY SYSTEMS", and filed on same day herewith, and which is hereby incorporated by reference herein.

BACKGROUND OF THE INVENTION

1. Field of the Invention

The invention relates to voltage generation and, more particularly, to voltage generation internal to memory systems.

2. Description of the Related Art

Memory cards are commonly used to store digital data for use with various products (e.g., electronics products). Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

FIG. 1 is a block diagram of a conventional memory system 100. The conventional memory system 100 represents, for example, a memory card (e.g., flash card). The conventional memory system 100 includes a memory controller 102 and memory chips 104–110. The number of memory chips 104–110 is dependent upon the storage capacity to be provided by the conventional memory system 100. The memory controller 102 receives an input voltage ($V_{IN}$) 112 and an Input/Output (I/O) bus 114. The memory controller 102 operates to supply an address/data/control bus 116 to each of the memory chips 104–110. In addition, the memory controller 102 produces a chip select (CS) signals 118 that is provided to chip enable (CE) terminals of each of the memory chips 104–110. The memory controller 102 uses the chip select signals 118 to selectively activate one of the memory chips 104–110 that is to be accessed for data storage or retrieval. In addition, since the memory chips 104–110 require various voltage levels for operation, the memory controller 102 includes a charge pump and regulation circuit 120. The charge pump and regulation circuit 120 is centrally provided in the memory controller 102 and produces several different output voltage levels that are supplied to each of the memory chips 104–110 over a voltage supply 122. As an example, the input voltage ($V_{IN}$) 112 might be 3.3 or 1.8 Volts and the different output voltage levels might be 3 Volts, 6 Volts, 12 Volts and 24 Volts.

Although the memory system 100 shown in FIG. 1 is suitable for high speed and high capacity usage, there have been problems in fabricating the memory controller 102 of the memory system 100. In particular, there exists only a limited number of semiconductor fabrication foundries that are able to and desirous of fabricating the memory controller 102 with the charge pump and regulator 120 incorporated therein. The charge pump and regulator circuit 120 requires high voltage devices and thus a more sophisticated fabrication process is required when fabricating the memory controller 102. Given the limited availability of foundries for fabricating the memory controller 102, it is desired to find alternative ways to produce a memory system that operates with high speed and high capacity yet avoids the need for sophisticated processing of the memory controller 102 so that more fabrication foundries are available.

One solution is to remove the charge pump and regulator 120 from the memory controller 102. This results in the memory controller 102 being substantially easier to fabricate and thus opens its fabrication up to numerous available foundries. The charge pump and regulator circuitry therefore need to be provided elsewhere within the memory system. In one approach, the charge pump and regulator circuitry can be provided within each memory chip. However, providing charge pump and regulator circuitry within the memory chips is not burdensome because the memory chip is already a sophisticated integrated circuit device that utilizes a sophisticated processing, particularly non-volatile (e.g., FLASH) memories. However, during operation, a problem results from the noise generated by the high voltage devices within the charge pump and regulator circuit. As a result, delicate analog circuitry within the memory chips is disturbed by this noise and therefore causes the performance of the memory chip to be slowed in order to compensate for the added noise.

Thus, there is a need for improved approaches for including charge pump and regulator circuitry within memory systems which do not limit foundry availability and which do not compromise performance.

SUMMARY OF THE INVENTION

Broadly speaking, the invention relates to techniques for producing and supplying various voltage levels within a memory system having multiple memory blocks (e.g., memory chips) and a controller chip. The various voltage levels can be produced by charge pump and regulator circuitry within the memory system. The various voltage levels can be supplied to the multiple memory blocks through a power bus. The memory system is suitable for high performance operation and foundry availability for controller fabrication is not hindered by the presence of voltage (supply) generation circuitry.

The invention can be implemented in numerous ways including, a system, device, or method. Several embodiments of the invention are discussed below.

As a memory system for storing data, one embodiment of the invention includes at least: a memory controller; a plurality of memory blocks operatively connected to the memory controller, each of the memory blocks including at least data storage elements and a voltage generation system; and a power bus operatively connected to the charge pump circuit for each of the memory blocks. During operating of the memory system, when one of the memory blocks is activated, the voltage generation system circuit within the one of the memory blocks is deactivated and instead another of the voltage generation system associated with another of the memory blocks is activated to supply different voltage level signals to the one of the memory blocks via the power bus. As a memory system, another embodiment of the invention includes at least: a first memory block including at least first data storage elements and a first charge pump circuit; a second memory block including at least second data storage elements and a second charge pump circuit; a memory controller operatively connected to the first memory block and the second memory block, the memory controller producing at least one select signal, the at least one select signal being used in selective activation of the first and second memory blocks; and a power bus operatively connecting the first charge pump circuit and the second charge pump circuit.

As a method for power generation within a memory system having a plurality of memory blocks, with each of the memory blocks including a power generation circuit, one embodiment of the invention includes at least the acts of: activating one of the memory blocks for data access while the other of the memory blocks are deactivated; activating one of the power generation circuits residing in one of the memory blocks that is deactivated; and supplying power from the one of the power generation circuits that is activated to the one of the memory blocks that is activated.

As a memory chip, one embodiment of the invention includes at least: a plurality of data storage elements for storage of data; and a power generation circuit for generating power signals. The memory chip includes a chip enable for enable/disable of the data storage elements of the memory chip, and the memory chip includes a charge pump enable for enable/disable of the power generation circuit.

As a memory system, another embodiment of the invention includes at least: a first memory block means for storing data in first data storage elements and for producing first power signals; a second memory block means for storing data in second data storage elements and for producing second power signals; a memory controller operatively connected to the first memory block means and the second memory block means, the memory controller producing at least one select signal, the at least one select signal being used in selective activation of the first and second memory block means; and a power bus for supplying either the first power signals to the second memory block means or the second power signals to the first memory block means.

As an electronic system, one embodiment of the invention includes at least: a data acquisition device; and a data storage device removably coupled to the data acquisition unit. The data storage device stores data acquired by the data acquisition device. The data storage device including at least: a memory controller; a plurality of memory blocks operatively connected to the memory controller, each of the memory blocks including at least data storage elements and a voltage generation system; and a power bus operatively connected to the charge pump circuit for each of the memory blocks. During operating of the data storage device, when one of the memory blocks is activated, the voltage generation system within the one of the memory blocks is deactivated and instead another of the voltage generation systems associated with another of the memory blocks is activated to supply different voltage level signals to the one of the memory blocks via the power bus.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to techniques for producing and supplying various voltage levels within a memory system having multiple memory blocks (e.g., memory chips) and a controller chip. The various voltage levels can be produced by charge pump and regulator circuitry within the memory system. The various voltage levels can be supplied to the multiple memory blocks through a power bus. The memory system is suitable for high performance operation and foundry availability for controller fabrication is not hindered by the presence of voltage (supply) generation circuitry.

According to one aspect of the invention, charge pump and regulator circuits (more generally, voltage generation circuits) are provided within each of the memory blocks of a memory system. Moreover, the charge pump and regulator circuits are selectively enabled to supply voltage signals to memory blocks other than their own memory blocks. As a result, noise generated by a charge pump and regulator circuit does not significantly disturb the operation of the active memory block selected for access because the charge pump and regulator circuit used is associated with another memory block.

Embodiments of this aspect of the invention are discussed below with reference to FIGS. 2–5. However, those skilled in the art will readily appreciate that the detailed description given herein with respect to these figures is for explanatory purposes as the invention extends beyond these limited embodiments.

Figure 1:
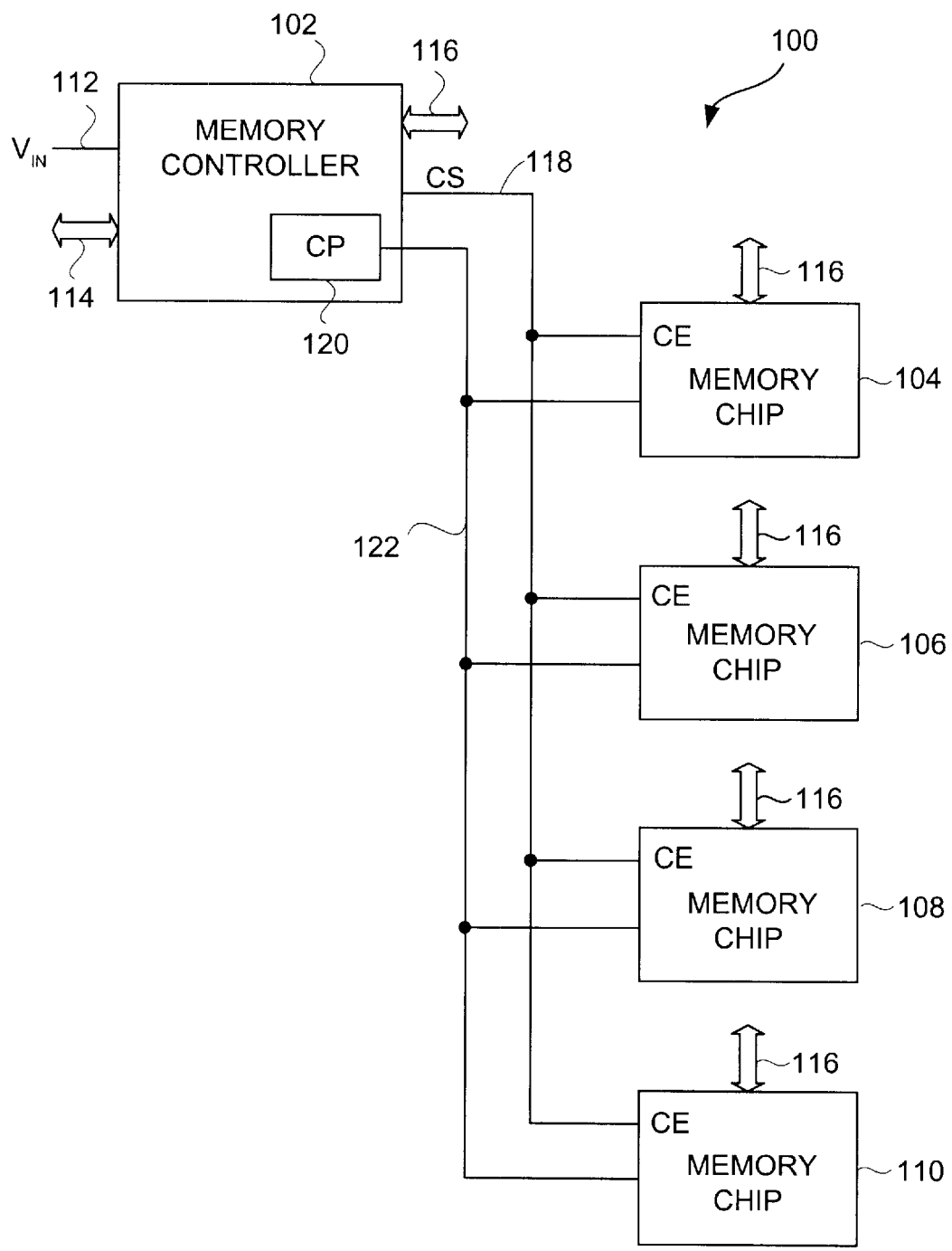
FIG. 1 is a block diagram of a conventional memory system.
Figure 2A:
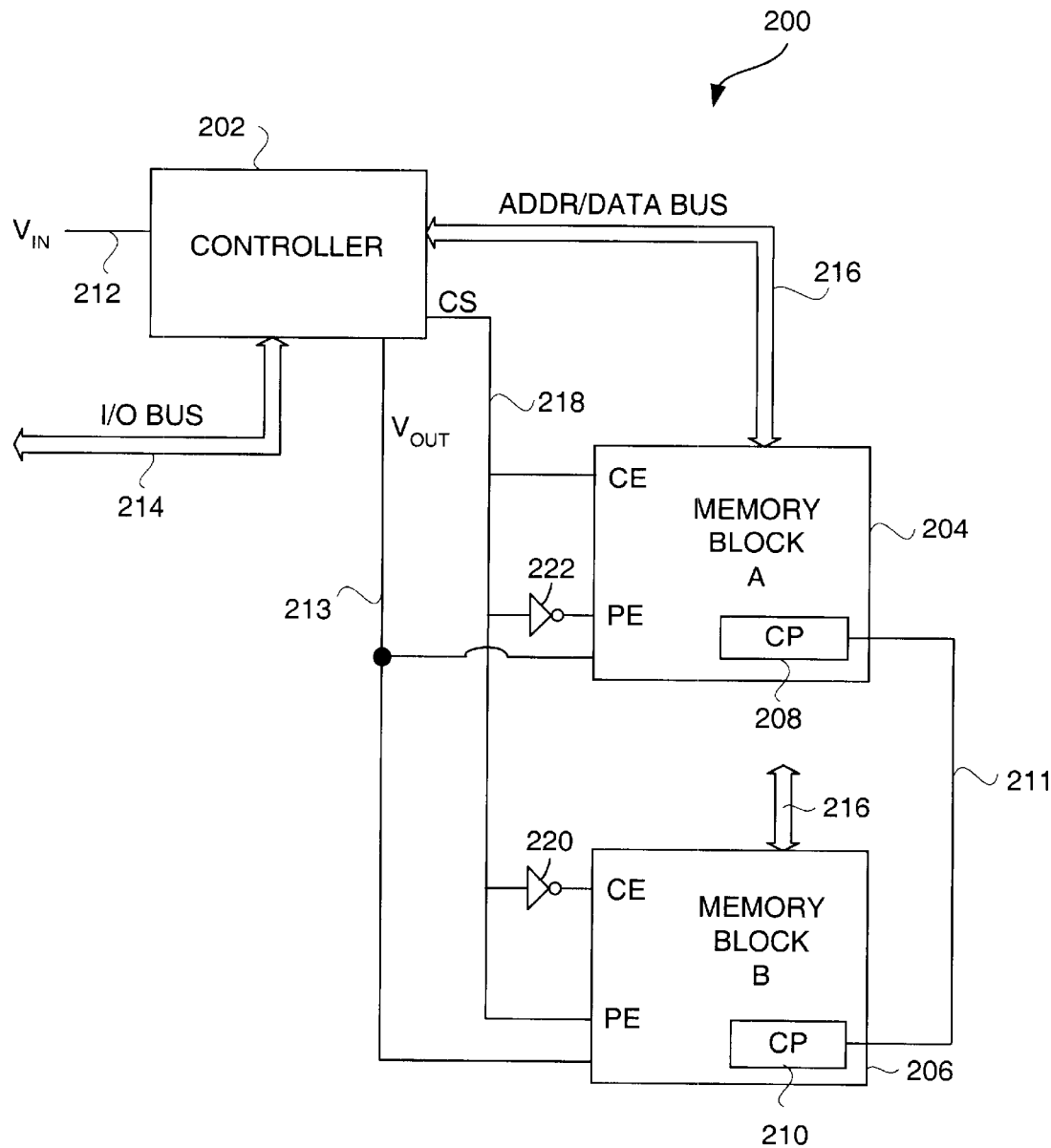
FIG. 2A is a block diagram of a memory system according to one embodiment of the invention.

FIG. 2A is a block diagram of a memory system 200 according to one embodiment of the invention. The memory system 200 is, for example, associated with a memory card (such as a plug-in card), a memory stick, or some other semiconductor memory product. Examples of memory cards include PC Card (formerly PCMCIA device), Flash Card, Flash Disk, Multimedia Card, and ATA Card.

The memory system 200 includes a controller 202, a memory block A 204, and a memory block B 206. The memory block A 204 includes a charge pump and regulator circuit 208. The memory block B 206 includes a charge pump and regulator circuit 210. The charge pump and regulator circuit 210 and the charge pump and regular circuit 208 are coupled together via a power bus 211. Each of the charge pump and regulator circuits 208 and 210 produce a plurality of different voltage level signals that are provided on the power bus 211 for use by the memory block A 204 or the memory block B 206.

The controller 202 receives an input voltage ($V_{IN}$) 212 and an Input/Output (I/O) bus 214. The controller 202 also outputs an output voltage ($V_{OUT}$) 213. The output voltage ($V_{OUT}$) 213 is supplied to the memory block A 204 and the memory block B 206. The controller 202 also couples to the memory block A 204 and the memory block B 206 with an address/data/control bus 216 and a chip select (CS) signal 218. The address/data/control bus 216 operates to supply address and data signals between the controller 202 and the memory blocks 204 and 206. The chip select signal 218 is produced by the controller 202 to selectively activate one of the memory blocks 204 and 206 through a chip enable (CE) input. In addition, the chip select signal 218 is supplied to a pump enable (PE) input and is used to selectively activate one of the charge pump and regulator circuits 208 and 210.

It should be noted that the controller 202 does not include charge pump and regulator circuitry which thus simplifies its fabrication as well as renders foundries more available. According to the invention, each of the memory blocks 204 and 206 include the charge pump and regulator circuits 208 and 210, respectively. Given that the memory blocks 204 and 206 already otherwise require complex fabrication processing, the addition of the charge pump and regulator circuits 208 and 210 does not lead to a foundry availability dilemma. However, because the charge pump and regulator circuits 208 and 210 generate significant noise in generating multiple different voltages, the invention further operates to control their usage so as to mitigate the impact of noise on the ability to access and operate the memory blocks 204 and 206.

More specifically, when the memory block A 204 is enabled (activated) by the chip select signal 218, the memory block B 206 is disabled (de-activated) by the chip select signal 218. An inverter 220 serves to invert the chip select signal 218 prior to being received at the chip enable (CE) input of the memory block B 206. Further, when the memory block A 204 is enabled, the charge pump and regulator circuit 208 within the memory block A 204 is disabled and the charge pump and regulator circuit 210 within the memory block B 206 is enabled. An inverter 222 serves to invert the chip enable signal 218 prior to being received at the pump enable (PE) input of the memory block A 204. Hence, when the memory block A 204 is enabled, the charge pump and regulator circuit 210 (within the memory block B 206) produces the voltage signals for use by the memory block A (namely, the memory cells therein) 204 via the power bus 211.

Alternatively, when the memory block B 206 is enabled (activated) by the chip select signal 218 (following inversion by the inverter 220), the memory block A 204 is disabled (de-activated) by the chip select signal 218. Further, when the memory block B 206 is enabled, the charge pump and regulator circuit 210 within the memory block B 206 is disabled and the charge pump and regulator circuit 208 within the memory block A 204 is enabled. Hence, when the memory block B 206 is enabled, the charge pump and regulator circuit 208 (within the memory block A 204) produces the voltage signals for use by the memory block B (namely, the memory cells therein) 206 via the power bus 211.

In this embodiment, the chip select signal 218 supplies the chip enable (CE) input as well as the pump enable (PE) input. The inverters 220 and 222 are logic devices that serve in this embodiment to ensure that not only are only one memory block and only one charge pump and regulator circuit enabled at a time, but also that the charge pump and regulator circuit that is enabled is within a different one of the memory blocks than the memory block that is enabled. Other logic devices and signals can additionally or alternatively be used to activate/de-activate the memory blocks and the charge pump and regulator circuits. These logic devices (including the inverters 220 and 222) can be integrated into either the controller 202 or the memory blocks 204 and 206.

The output voltage ($V_{OUT}$) 213 can be the input voltage ($V_{IN}$) 212 as received by the controller 202 and passed on (e.g., unregulated) the memory blocks 204 and 206. The charge pump and regulator circuits 208 and 210 produce the voltage signals for use by the memory blocks 204 and 206 using the output voltage ($V_{OUT}$) 213. Such an arrangement follows when, as noted above, the controller 202 does not include charge pump and regulator circuitry. Though it is possible that the controller 202 include regulator circuitry to regulate the be the input voltage ($V_{IN}$) 212 to produce the output voltage ($V_{OUT}$) 213 to a particular voltage level. However, inclusion of regulator circuitry would render fabrication somewhat more complicated and render foundries less available.

It should also be noted that in other embodiments, the output voltage ($V_{OUT}$) 213 need to be utilized; instead, the input voltage ($V_{IN}$) 212 could be directly or indirectly supplied to the memory blocks 205 and 206. Additional details on such embodiments or configurations can be found in U.S. patent application Ser. No. 09/788,120, now U.S. Pat. No. 6,434,044, entitled "METHOD AND SYSTEM FOR GENERATION AND DISTRIBUTION OF SUPPLY VOLTAGES IN MEMORY SYSTEMS", and filed on same day herewith, and which is hereby incorporated by reference herein.

Figure 2B:
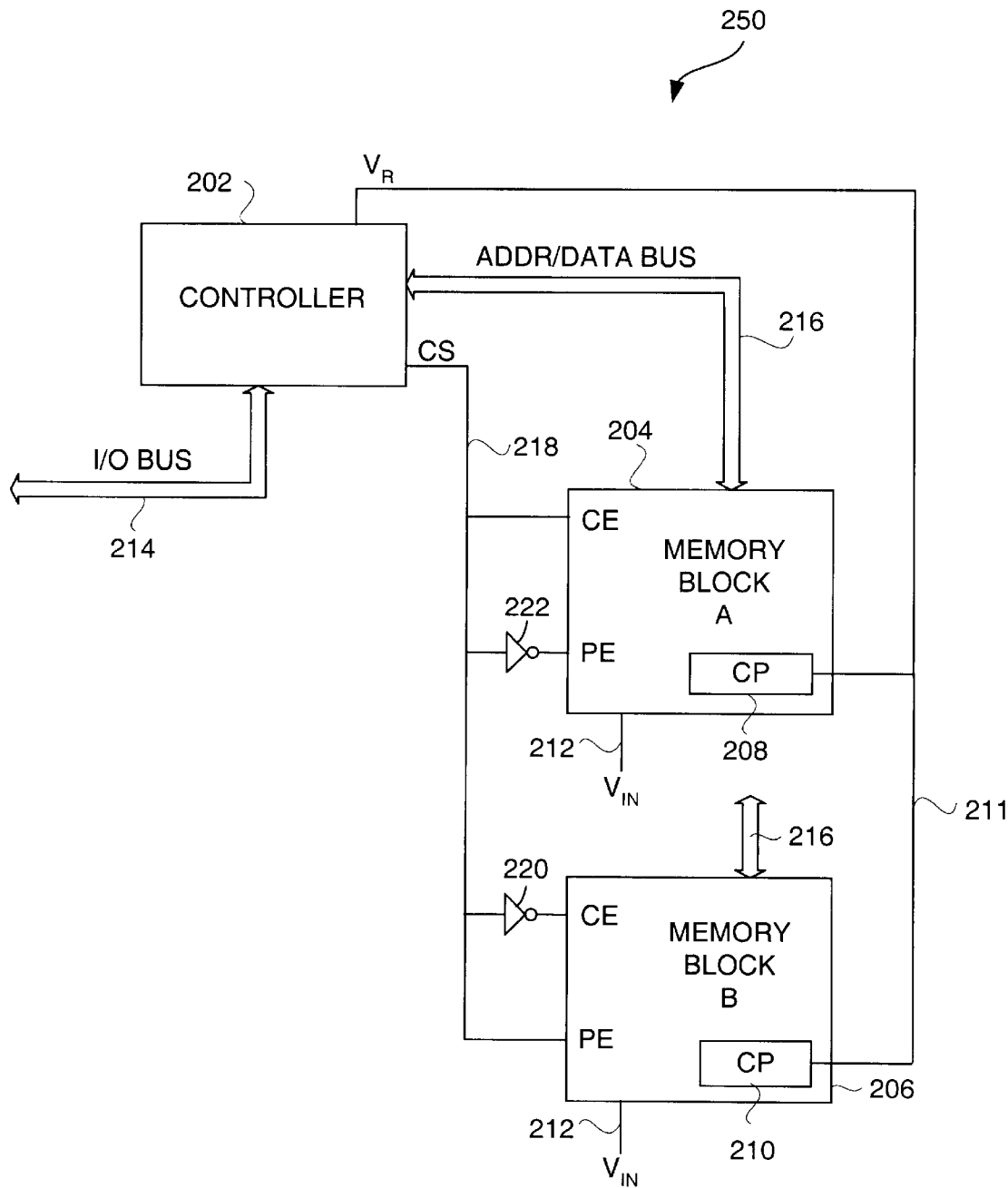
FIG. 2B is a block diagram of a memory system according to an alternative arrangement for the embodiment shown in FIG. 2A.

FIG. 2B is a block diagram of a memory system 250 according to an alternative arrangement for the embodiment shown in FIG. 2A. Although generally similar to the memory system in FIG. 2A, the memory system 250 provides the input voltage ($V_{IN}$) 212 directly to the memory blocks 206 and 208. In addition, to provide a supply voltage to the controller 202, the charge pump and regulator circuits 208 and 210 produce a regulated voltage (VR) that can be supplied to the controller via the power bus 211. Hence, with this arrangement, the controller receives the regulated voltage (VR) as opposed to the input voltage ($V_{IN}$) 212.

Figure 3A:
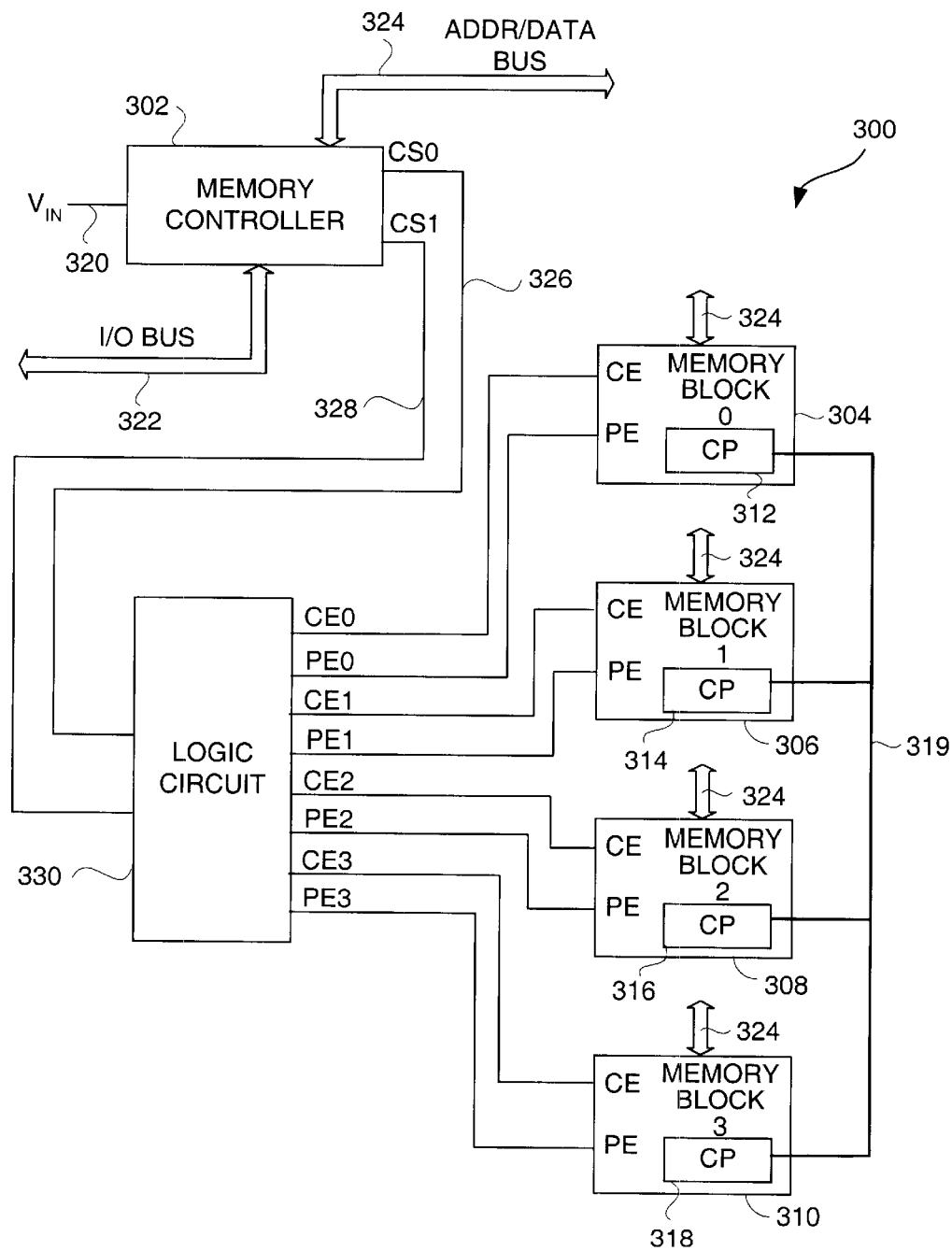
FIG. 3A is a block diagram of a memory system according to another embodiment of the invention.

FIG. 3A is a block diagram of a memory system 300 according to another embodiment of the invention. The memory system 300 is, for example, associated with a memory card (such as a plug-in card), a memory stick, or some other semiconductor memory product.

The memory system 300 includes a memory controller 302 and memory blocks 304–310. In this embodiment, the memory system 300 includes four separate memory blocks, namely, memory blocks 304–310. However, it should be understood that the memory system 300 can, in general, include two or more memory blocks. Each of the memory blocks 304–310 includes a charge pump and regulator circuit 312–318, respectively. The charge pump and regulator circuits 312–318 are interconnected in parallel by a power bus 319. Each of the memory blocks 304–310 also include an array of memory cells that provide non-volatile digital data storage. The memory cells are electrically programmable and electrically erasable. Generally, memory cells are data storage elements. The memory blocks can, for example, be EEPROM or FLASH devices. The memory blocks 304–310 are each separate semiconductor dies, chips or products. The memory controller 302 is also a separate semiconductor die, chip or product.

The memory controller 302 receives an input voltage ($V_{IN}$) 320. In addition, the memory controller 302 couples to an Input/Output (I/O) bus 322. The memory controller 302 supplies an address/data/control bus 324 to each of the memory blocks 304–310. In addition, the memory controller 302 produces chip select signal (CS0) 326 and chip select signal (CS1) 328. The chip select signal 326 and the chip select signal 328 are supplied to a logic circuit 330. The logic circuit 330 produces a chip enable signal and a pump enable signal for each of the memory blocks 304–310. More specifically, the logic circuit 330 produces chip enable signals CE0, CE1, CE2 and CE3 which are respectively supplied to chip enable (CE) inputs (e.g., input terminals) of the memory blocks 304–310. These chip enable signals CE0, CE1, CE2 and CE3 thus respectively determine whether the memory blocks 304–310 are enabled (activated) or disabled (de-activated). During operation, normally only one of the memory blocks 304–310 is enabled at a time. Further, the logic circuit 330 produces pump enable signals PE0, PE1, PE2 and PE3 which are respectively supplied to pump enable (PE) inputs (e.g., input terminals) of the memory blocks 304–310. These pump enable signals PE0, PE1, PE2 and PE3 thus respectively determine whether the charge pump and regulator circuits 312–318 are enabled (activated) or disabled (de-activated). During operation, normally only one of the charge pump and regulator circuits 312–318 is enabled (activated) at a time. Still further, the only one of the charge pump and regulator circuits 312–318 being enabled is in a different one of the memory blocks 304–310 than the one of the memory blocks 304–310 being enabled.

In other words, the chip enable (CE) input is used to enable/disable the memory blocks 304–310. As such, the ability to access (e.g., read, program or erase) the memory cells within the memory blocks 304–310 are controlled by the chip enable signals which are supplied by the logic circuit 330. For example, when the chip enable (CE) input is "high" (or logic level "1"), the memory cells within the associated memory block are coupled to the address/data/control bus 324 and therefore can be accessed. Alternatively, when the chip enable (CE) input is "low" (or logic level "0") the memory cells within the memory block are isolated from the address/data/control bus 324. In addition, when the pump enable (PE) input is "high", the associated charge pump and regulator circuit is enabled (active) so as to produce various voltage signals. On the other hand, when the pump enable (PE) input is "low", the charge pump and regulator circuit is disabled (inactive).

According to the decoding of the chip select signals 326 and 328 by the logic circuit 330, only one of the memory blocks 304–310 and only one of the charge pump and regulator circuits 312–318 is enabled at any given point in time. However, the one of the charge pump and regulator circuits 312–318 that is enabled is within a different memory block than the one of the memory blocks 304–310 being activated so that the memory cells therein can be accessed without noise hindrance from the active charge pump and regulator circuit. For example, if the chip select signals 326 and 328 cause the chip enable (CE) input for the memory block 304 to be "high", then the memory block 304 (in particular, its memory cells therein) are enabled. However, at the same time, the charge pump and regulator circuit 312 for the memory block 304 is disabled. Instead, any of the charge pump and regulator circuits 314, 316 and 318 can be enabled to supply the needed voltage signals to the memory block 304 via the power bus 319. As a consequence, the noise produced by the charge pump and regulator circuit 314, 316 or 318 is largely isolated from the memory block 304 in which the memory cells are being accessed.

Table 1 represents an exemplary embodiment for enabling the memory blocks and their charge pump and regulator circuits. Table 1 reflects an exemplary operation of the logic circuit 330, where the chip select signals (CS0 and CS1) 326 and 328 are inputs, and the chip enable signals (CE0, CE1, CE2 and CE3) and the pump enable signals (PE0, PE1, PE2 and PE3) for the memory blocks 304–310 are outputs.

TABLE 1

| Chip Select | | Chip Enable & Pump Enable | | | | | | | |
|---|---|---|---|---|---|---|---|---|---|
| CS1 | CS0 | CE0 | PE0 | CE1 | PE1 | CE2 | PE2 | CE3 | PE3 |
| 0 | 0 | 1 | 0 | 0 | 0 | 0 | 0 | 0 | 1 |
| 1 | 0 | 0 | 0 | 1 | 0 | 0 | 1 | 0 | 0 |
| 0 | 1 | 0 | 0 | 0 | 1 | 1 | 0 | 0 | 0 |
| 1 | 1 | 0 | 1 | 0 | 0 | 0 | 0 | 1 | 0 |

The exemplary operation of the logic circuit 330 in accordance with Table 1 is further explained as follows. When the chip select signals 326 and 328 are both "low", then the chip enable (CE) input for the memory block 304 is "high" and the pump enable (PE) input for the charge pump and regulator circuit 318 within the memory block 310 is enabled. In this case, the memory cells within the memory block 304 are enabled while the charge pump and regulator circuit 318 associated with the memory block 310 is enabled to supply the voltage signals to the memory block 304 over the power bus 319. Also, in this case, the other of the memory blocks 306–310 and the other of the charge pump and regulator circuits 312–316 are all disabled. Similarly, when the chip select signal 326 is "low" and the chip select signal 328 is "high", then the chip enable (CE) input for the memory block 306 is "high" and the pump enable (PE) input for the charge pump and regulator circuit 316 within the memory block 308 is enabled. Likewise, when the chip select signal 326 is "high" and the chip select signal 328 is "low", then the chip enable (CE) input for the memory block 2 308 is "high" and the pump enable (PE) input for the charge pump and regulator circuit 314 is "high". Finally, when the chip select signal 326 and the chip select signal 328 are both "high", then the chip enable (CE) input for the memory block 310 is "high" and the pump enable (PE) input for the charge pump and regulator circuit 312 is "high".

Figure 3B:
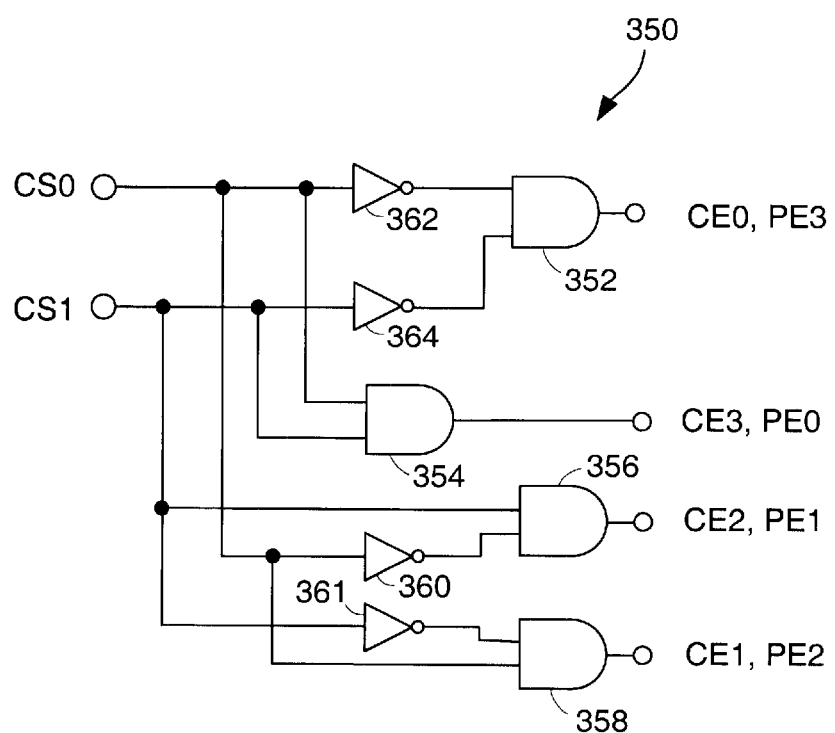
FIG. 3B is a schematic diagram of a logic circuit according to one embodiment of the invention.

FIG. 3B is a schematic diagram of a logic circuit 350 according to one embodiment of the invention. The logic circuit 350 represents one embodiment for the logic circuit 330 illustrated in FIG. 3A. In particular, the logic circuit 350 produces chip enable (CE) signals and pump enable (PE) signals for four (4) separate memory blocks. The logic circuit 350 receives the chip select signals CS0 and CS1 as input and outputs chip enable signals CE0–CE3, and pump enable signals PE0–PE3. The logic circuit 350 includes AND gates 352–358 and inverters 360–364.

The arrangement for the logic circuit 350 shown in FIG. 3B represents one embodiment for the logic circuit 330. It should be understood by those skilled in the art that various other implementations and arrangements can be utilized for the logic circuit 330. Also, as noted above, the use of a particular charge pump and regulator circuit within another of the memory blocks to supply voltage signals to an enabled memory block can also vary from that depicted in FIG. 3B.

Figure 4:
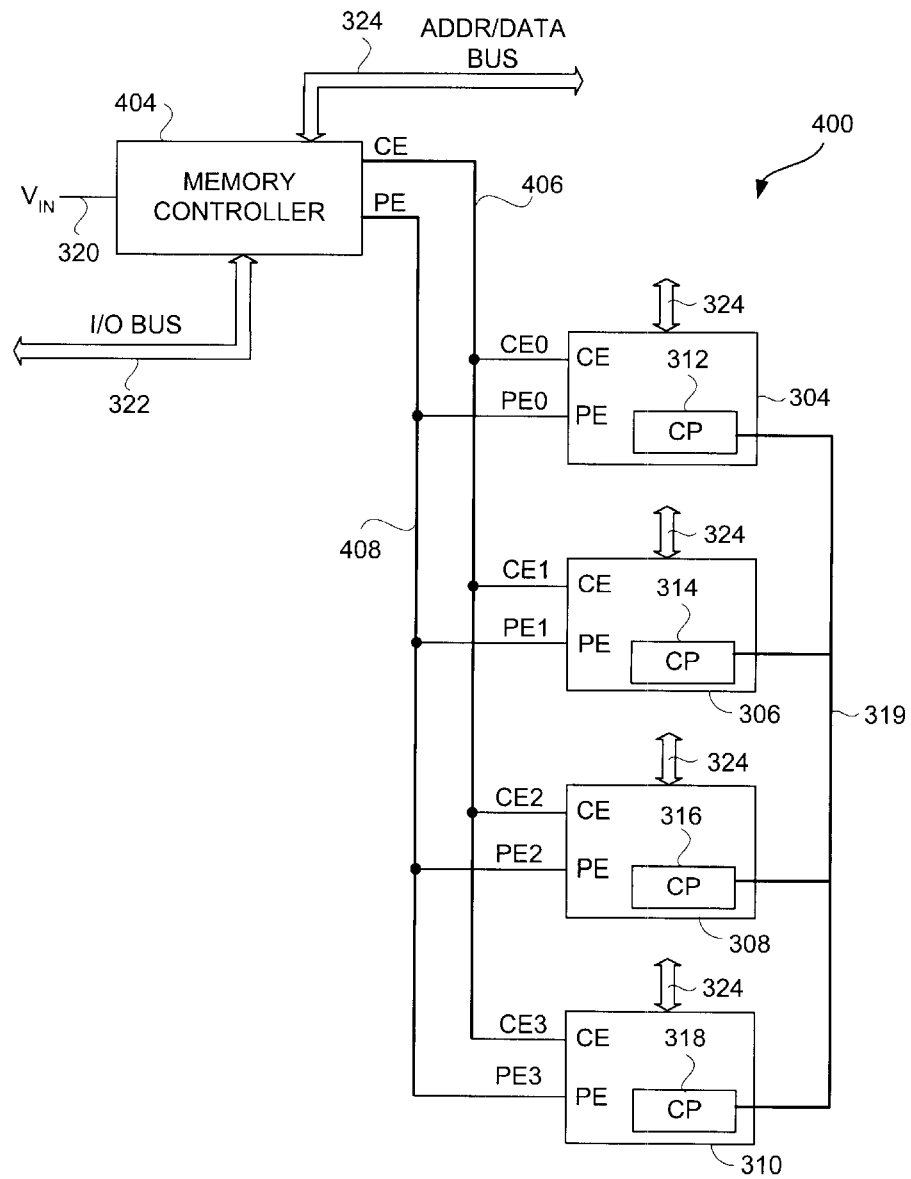
FIG. 4 is a block diagram of a memory system according to another embodiment of the invention.

FIG. 4 is a block diagram of a memory system 400 according to another embodiment of the invention. The memory system 400 is generally similar to the memory system 300 illustrated in FIG. 3A. However, the memory system 400 includes a memory controller 404 that directly produces a chip enable (CE) signal and a pump enable (PE) signal for each of the memory blocks 304–310. As compared with the memory system 300, the memory controller 404 includes logic to enable/disable not only each of the memory blocks 304–310 but also each of the charge pump and enable circuits 312–318. The chip enable (CE) signals are supplied to the memory blocks 304–310 over a CE bus 406. The pump enable (PE) signals are supplied to the memory blocks 304–310 over a PE bus 408. More particularly, the CE bus 406 carries chip enable signals (CE0, CE1, CE2 and CE3), and the PE bus 408 carries pump enable signals (PE0, PE1, PE2 and PE3).

Figure 5:
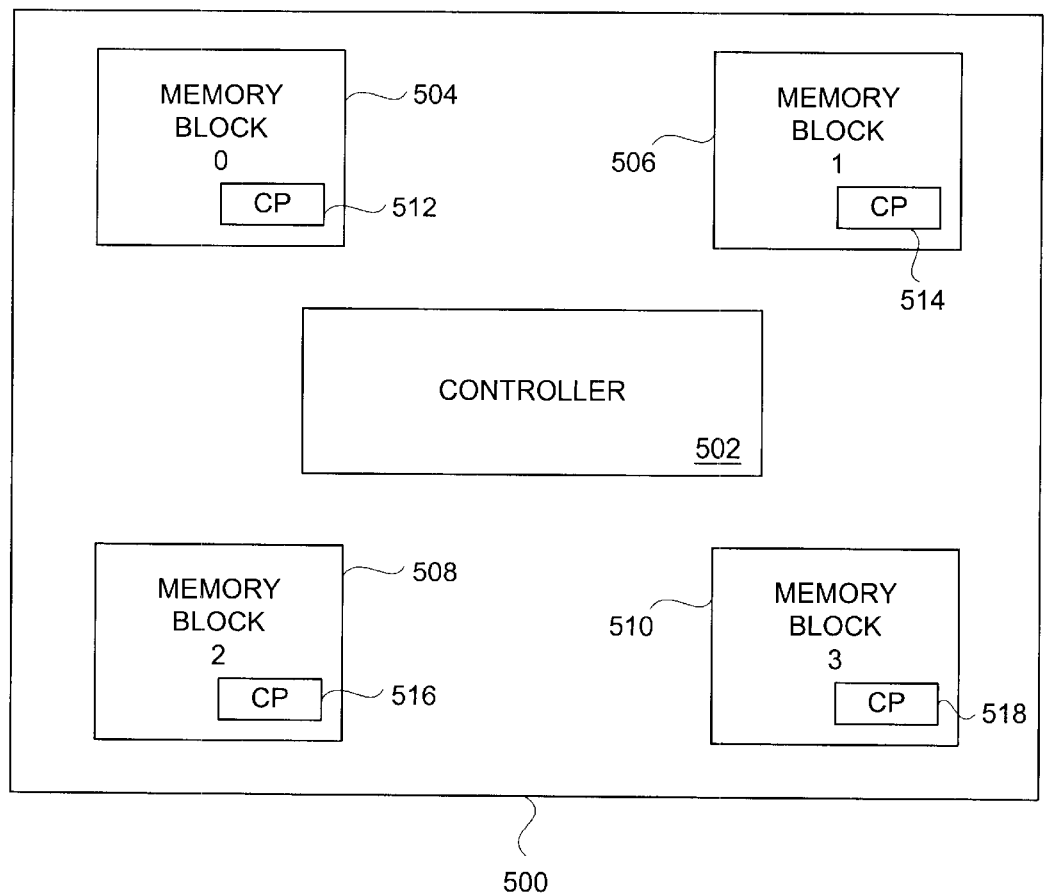
FIG. 5 is a block diagram of a memory card according to one embodiment of the invention.

FIG. 5 is a block diagram of a memory card 500 according to one embodiment of the invention. The memory card 500 is, for example, a packaged data storage product. The memory card 500 illustrates a representative layout for the plurality of memory blocks associated with and provided within the memory card 500. In particular, the representative memory card 500 includes a memory block 504, a memory block 506, a memory block 508, and a memory block 510. Each of the memory blocks 504–510 includes a charge pump and regulator circuit 512, 514, 516 and 518, respectively. The memory blocks 504–510 are laid out on the memory card 500 such that each one of the memory blocks is provided proximate to a corner of the memory card. In this case, the layout facilitates a separation of the charge pump and regulator circuits 512–518 from other of the memory blocks 504–518. As in other embodiments, the controller 502 controls which of the memory blocks and charge pump and regulator circuits are enabled (activated) at any given point in time. According to the invention, the controller 502 causes the charge pump and regulator circuit associated with a different memory block to be enabled to supply various different voltages to the particular memory block being activated to access its memory cells. For example, when the memory block 504 is being enabled to access its memory cells, the charge pump and regulator circuit 518 within the memory block 510 can be enabled to supply the needed voltage signals to the memory block 504. Similarly, when the memory block 510 is enabled to access its memory cells, the charge pump and regulator circuit 512 within the memory block 504 can be enabled to supply the needed voltage signals to the memory block 510. Similarly, when the memory block 506 is enabled to access its memory cells, the charge pump and regulator circuit 516 within the memory block 508 is enabled. Also, when the memory block 508 is enabled to access its memory cells, the charge pump and regulator circuit 514 associated with the memory block 506 is enabled. The voltage signals are coupled to a power bus that couples to each of the charge pump and regulator circuits 512–518. Although the power bus is not illustrated in FIG. 5, in one embodiment, the power bus could be provided around the periphery of the memory card 500 and couple to each of the charge pump and regulator circuits 512–518.

The invention is suitable for use with both single-level memories and multi-level memories. In multi-level memories, each memory cell stores two or more bits of data.

The invention can further pertain to an electronic system that includes a memory system as discussed above. Memory systems (i.e., memory cards) are commonly used to store digital data for use with various electronics products. Often, the memory system is removable from the electronic system so the stored digital data is portable. The memory systems according to the invention can have a relatively small form factor and be used to store digital data for electronics products such as cameras, hand-held or notebook computers, network cards, network appliances, set-top boxes, hand-held or other small audio players/recorders (e.g., MP3 devices), and medical monitors.

The advantages of the invention are numerous. Different embodiments or implementations may yield one or more of the following advantages. One advantage of the invention is that fabrication of controllers for memory systems is easier to arrange. Another advantage of the invention is that noise from generation of different voltage levels does not hinder memory access performance. Still another advantage of the invention is that reliable, high performance memory systems can be obtained.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A memory system for storing data, said memory system comprising:
   a memory controller;
   a plurality of memory blocks operatively connected to said memory controller, each of said memory blocks including at least data storage elements and a voltage generation system; and
   a power bus operatively connected to the voltage generation system for each of said memory blocks.
   wherein during operating of said memory sytem, when one of said memory blocks is activated, said voltage generation system within the one of said memory blocks is deactivated and instead another of said voltage generation systems associated with another of said memory blocks is activated to supply several different voltage level signals to the one of said memory blocks being activated via said power bus.

2. A memory system as recited in claim 1, wherein said voltage generation system being activated produces the several different voltage level signals.

3. A memory system as recited in claim 1, wherein said voltage generation circuit comprises a charge pump circuit and a regulator circuit.

4. A memory system as recited in claim 1, wherein each of said memory blocks is a separate integrated circuit.

5. A memory system as recited in claim 1,
   wherein said memory controller produces a plurality of select signals, and
   wherein each of said memory blocks receives at least one of the first select signal and the second select signal for controlling activation or deactivation of said memory blocks.

6. A memory system as recited in claim 1,
   wherein said memory controller produces a first signal and a second signal,
   wherein each of said memory blocks receives the first signal for controlling activation or deactivation of said memory blocks, and receives the second signal for activation or deactivation of said voltage generation systems, and
   wherein said memory system further comprises:
   a logic circuit operatively coupled to said memory controller and said memory blocks, said logic circuit controlling the activation and deactivation of said memory blocks as well as said voltage generation system based on the first and second signals supplied from said memory controller.

7. A memory system as recited in claim 1, wherein said memory system is a memory card.

8. A memory system as recited in claim 1, wherein at least one of the several different voltage level signals is supplied to said memory controller via said power bus.

9. A memory system as recited in claim 1, wherein said memory controller receives an externally supplied input voltage and produces a regulated supply voltage therefrom, and wherein said memory blocks receive the regulated supply voltage form said memory controller.

10. A memory system, comprising:
a first memory block including at least first data storage elements and a first charge pump circuit, the first charge pump circuit producing a first plurality of operational voltages when activated;
a second memory block including at least second data storage elements and a second charge pump circuit, the second charge pump circuit producing a second plurality of operational voltages when activated;
a memory controller operatively connected to said first memory block and said second memory block, said memory controller producing at least one select signal, the at least one select signal being used in selective activation of said first and second memory blocks; and
a power bus operatively connecting said first charge pump circuit and said second charge pump circuit,
wherein the at least one select signal is used to activate one of said first and second memory blocks and one of the first and second charge pump circuits such that when said first memory block is activated, the second charge pump circuit is activated, and when said second memory block is activated, the first charge pump circuit is activated.

11. A memory system as recited in claim 10, wherein said memory system further comprises:
a first logic circuit between the at least one select signal and said first memory block.

12. A memory system as recited in claim 11, wherein said memory system further comprises:
a second logic circuit between the at least one select signal and said second memory block.

13. A memory system as recited in claim 10, wherein said memory system further comprises:
a logic circuit between the at least one select signal said first and second memory blocks.

14. A memory system as recited in claim 10, wherein said memory system further comprises:
a logic circuit operatively coupled to said memory controller and said first and second memory blocks, said logic circuit controlling the activation and deactivation of said first and second memory blocks as well as said first and second charge pump circuits provided therein based on the at least one select signal supplied from said memory controller.

15. A memory system as recited in claim 10, wherein said memory system is a memory card.

16. A memory system as recited in claim 10, wherein the first and second data storage elements provide semiconductor-based data storage.

17. A memory system as recited in claim 16, wherein the first and second data storage elements are EEPROM or FLASH.

18. A memory system as recited in claim 10, wherein each of the memory blocks is a separate semiconductor product.

19. A method for supplying power within a memory system having a plurality of memory blocks, with each of the memory blocks including a power generation circuit, said method comprising:
activating one of the memory blocks for data access while the other of the memory blocks are deactivated;
activating one of the power generation circuits residing in one of the memory blocks that is deactivated; and
supplying power from the one of the power generation circuits that is activated to the one of the memory blocks that is activated, said supplying operating to supply a plurality of different voltage signals from the one of the power generation circuits that is activated to the one of the memory blocks that is activated.

20. A method as recited in claim 19, wherein the power generation circuits, when activated, produce multiple voltage level signals.

21. A method as recited in claim 19, wherein each of the memory chips includes at least data storage elements for storing data.

22. A method as recited in claim 21, wherein the data storage elements provide semiconductor-based data storage.

23. A method as recited in claim 21, wherein the data storage elements are EEPROM or FLASH.

24. A method as recited in claim 19, wherein each of the memory blocks is a separate semiconductor product.

25. A method as recited in claim 24, wherein the separate semiconductor products comprise a semiconductor die.

26. A method as recited in claim 24, wherein the separate semiconductor products are semiconductor chips.

27. A method as recited in claim 19, wherein the memory system further includes a controller block that controls said activating of the one of the memory blocks for data access and said activating of the one of the power generation circuits.

28. A method as recited in claim 27, wherein said method further comprises:
supplying power from the one of the power generation circuits that is activated to the controller block.

29. A method as recited in claim 19, wherein a power bus is used to supply the plurality of different voltage signals from the one of the power generation circuits that is activated to the one of the memory blocks that is activated.

30. A memory system, comprising:
a first memory block means for storing data in first data storage elements and for producing first power signals, the first power signals including a plurality of different voltage signals;
a second memory block means for storing data in second data storage elements and for producing second power signals, the second power signals including a plurality of different voltage signals;
a memory controller operatively connected to said first memory block means and said second memory block means, said memory controller producing at least one select signal, the at least one select signal being used in selective activation of said first and second memory block means; and
a power bus for supplying either the first power signals to said second memory block means or the second power signals to said first memory block means.

31. A memory system as recited in claim 30, wherein said memory system further comprises:
logic means for modifying the at least one select signal to selectively enable the coupling of the first power signals to said power bus or the coupling of the second power signals to said power bus.

32. A memory system as recited in claim 31, wherein said logic means further enables the activation of one of the first data storage elements and the second data storage elements.

33. An electronic system, comprising:
a data acquisition device; and
a data storage device removably coupled to said data acquisition unit, said data storage device stores data acquired by said data acquisition device, and said data storage device including at least
a memory controller;
a plurality of memory blocks operatively connected to said memory controller, each of said memory blocks including at least data storage elements and a voltage generation system; and a power bus operatively connected to the voltage generation system for each of said memory blocks, wherein during operating of said data storage device, when one of said memory blocks is activated, said voltage generation system within the one of said memory blocks is deactivated and instead another of said voltage generation systems associated with another of said memory blocks is activated to supply different voltage level signals to the one of said memory blocks via said power bus.

34. An electronic system as recited in claim 33, wherein said data acquisition device is one of a camera, a network card or appliance, hand-held or notebook computer, set-top box, hand-held or other small audio player/recorder, and medical monitor.

* * * * *